(12) United States Patent
Muraguchi et al.

(10) Patent No.: US 6,430,813 B2
(45) Date of Patent: Aug. 13, 2002

(54) ELECTRIC SHAVER

(75) Inventors: Katsumi Muraguchi, Tsuna-gun; Takeji Furuichi, Sumoto, both of (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/788,606

(22) Filed: Feb. 21, 2001

(30) Foreign Application Priority Data

| Feb. 23, 2000 | (JP) | ................................ 2000-046537 |
| Feb. 29, 2000 | (JP) | ................................ 2000-053346 |
| Feb. 29, 2000 | (JP) | ................................ 2000-054822 |

(51) Int. Cl.⁷ .............................................. B26B 19/38
(52) U.S. Cl. .................. 30/43.92; 30/DIG. 1; 320/114; 320/115
(58) Field of Search ................................ 30/43.6, 43.9, 30/43.92, DIG. 1, DIG. 2, 231; 320/114, 115, 128

(56) References Cited

U.S. PATENT DOCUMENTS

| 3,311,763 A | * | 3/1967 | Jepson et al. ................ 30/43.9 |
| 3,389,323 A | * | 6/1968 | Jepson et al. ................ 320/115 |
| 4,092,581 A | * | 5/1978 | Ascoli ......................... 320/114 |
| 4,835,452 A | | 5/1989 | Kuriyama ....................... 320/2 |
| 5,256,953 A | * | 10/1993 | Cimbal et al. ................ 320/114 |
| 5,268,629 A | * | 12/1993 | Franke ......................... 320/114 |
| 6,112,414 A | * | 9/2000 | Andis et al. ................... 30/231 |

* cited by examiner

Primary Examiner—Hwei-Slu Payer
(74) Attorney, Agent, or Firm—Wenderoth, Lind & Ponack, L.L.P.

(57) ABSTRACT

An electric shaver comprises an inner case which retains an electronic part board and an outer casing which retains a plug pin board which secures a plurality of plug pins. The inner case is fabricated of a plastic integral with a bottom wall. The electronic part board is disposed above the lower separating wall while the plug pin board is disposed under the lower separating wall. Metal pins penetrating the lower separating wall connects the electronic part board and the plug pin board. The bottom opening of the outer casing is closed with a bottom cover. The bottom cover has a pair of through holes through which extend outwardly a pair of plug pins.

20 Claims, 11 Drawing Sheets

ELECTRIC SHAVER

This application is based on applications No. 053346/2000 filed in Japan on Feb. 29, 2000, No. 046537/2000 filed in Japan on Feb 23, 2000 and No. 054822/2000 filed in Japan on Feb. 29, 2000, the contents of which are incorporated herein by reference.

BACKGROUND OF THE INVENTION

The present Invention relates to an electric shaver having a circuit board with electronic parts thereon, and a pair of plug pins projecting from the body casing.

There are two types of electric shaver, i.e. the one having a built-in wire, and the other having a detachable electrical wire.

The latter must be provided with a plug pins protruding from the body casing in order to detachably connect a power source electric wire.

Prior art shavers have a pair of plug pins secured on a plug board and the plug board is firmly retained in the casing so as to secure the plug pins to the body casing.

The plug board needs a set of lead wires connected to the plug pins. Related art shavers have a circuit board provided with electronic parts as well as a plug board, electrically connected to each other but separately secured in the body casing.

The structure of the related art shavers has the drawbacks that assembling worktakes a lot of time because the electronic parts board and the plug board together with electrical wires connecting these boards must be placed into the casing.

The structure also incurs a higher manufacturing cost because of a rather complicated configuration of the casing due to the fact that the casing must be configured so as to receive the parts board and the plug board separately.

There are also washable electric shavers. This type of electric shaver is convenient because the user can wash it, and thus a waterproof electric shaver requires a watertight casing. A watertight structure is easily produced by employing a cylindrical body casing. With a cylindrical casing, a watertight structure is readily achieved by employing watertight sealing means on the upper and lower ends of the casing. However, a cylindrical casing makes it difficult to insert a parts board and a plug board, which are electrically connected to each other by means of electrical wires. Mounting these boards in a cylindrical casing can be facilitated by employing an outer casing and an inner case to be inserted in the outer casing, and the parts board and plug board are mounted on the inner case.

The electric shaver with this structure has the parts board secured to the inner case, and the parts board is electrically connected by means of lead wires of the plug board.

The electric shaver of this structure requires assembling work in which the parts board and plug board are inserted together with electrical wires connecting the boards, and the electrical wires can cause trouble.

In the case where the parts board and the plug board are separately secured to the inner case, the configuration of the inner case becomes so complicated that it results in higher production costs.

SUMMARY OF INVENTION

The present invention is proposed to overcome these drawbacks. The most important object of the present invention is to provide an electric shaver having a simple structure and yet is easy to assemble with a parts board and plug board secured on the inner case.

Another important object of the present invention is to provide an electric shaver with a plug board firmly secured to the inner case on which plug board are fixed plug pins.

The above and further objects and features of the invention will be more fully apparent from the following detailed description and accompanying drawings.

The electric shaver of the present invention includes an electric motor for reciprocating an inner blade assembly, batteries for supplying power to the motor, an electronic parts board connected to the batteries, an inner case securing the electronic parts board, the electric motor and the batteries are inserted into an outer casing, and a plug pin board securing the plug pins, which protrude from the outer surface of the outer casing.

Furthermore, the electric shaver of the present invention has the construction described below.

The inner case has a lower separating wall integral therewith and made of a plastic, the periphery of which sealingly abuts on the inner surface of the outer casing. The inner case secures an electronic parts board above the lower separating wall. Furthermore, the inner case secures a plug board parallel to the case under the lower separating wall. The electronic parts board and the plug board are connected by metal pins. One end of each of the metal pins is fixed to the electronic parts board and the other is fixed to the plug board. Each of the metal pins pierces through a hole and is retained in the inner case. The outer casing has an open end which is closed by a bottom cover. The bottom cover has a plurality of through holes for plug pins which extend outwardly from the outer casing.

The construction of the electric shaver is characterized by the simplicity of construction and ease of assembly, wherein. the electronic parts board and the plug board are fixed on the inner case and the inner case is then inserted into the outer casing. The advantage of the electric shaver according to the present invention is obtained by the construction wherein the inner case is formed integrally with the lower separating wall abutting on the internal surface of the outer casing, and the electronic parts board and the plug board are connected by metal pins penetrating the lower separating wall. With the simple construction, the electric shaver according to the present invention enables the electronic parts board to be secured on the plug pins in a predetermined position. Using the metal pins instead of lead wires connecting the electronic parts board and the plug board, the shaver according to the present invention eliminates the lead wires connecting the electronic parts board and the plug board thereby facilitating the assembly work.

The outer casing of the shaver according to the present invention is preferably fabricated of a plastic with a tubular configuration. The lower separating wall is provided with an O-ring at its periphery for a watertight connection with the outer casing, while the plug pins are provided with an O-ring abutting on the inner surface of the bottom cover for a watertight connection with the through holes. The construction of the electric shaver of the present invention can be used for a watertight electric shaver.

The electric shaver with a watertight lower separating wall and the bottom cover with watertight plug pins is preferably provided with a safety valve on the bottom cover which functions as a relief valve that is actuated at a predetermined pressure level in a space enclosed by the lower separating wall, bottom cover and the outer casing.

The safety valve thus prevents gas from entering the upper block, thereby avoiding damage to electronic parts.

Furthermore, the inner case, which is made of a plastic, has latch means integral with the case to retain the electronic parts board. Thus, the electric shaver of the present invention retains the electronic parts board in the inner case.

The ends of the metal pins of the electric shaver of the present invention are fixed by soldering to the electronic parts board or to the plug board. By this method, the metal pins are secured to the electronic parts board and to the plug board.

The inner case according to the present invention is formed integrally with a tubular case to retain two batteries disposed side by side and in parallel to the electronic parts board. The inner case is preferably formed integral with hub portions for retaining the bottom cover. The hub portions are disposed at hollow spaces between the two cylindrical batteries.

The electric shaver having the construction that the inner case with an integral tubular case, in which batteries are retained, is preferably provided with the retainer having a closed upper end and an open bottom end. The lower ends of the batteries retained in the tubular retainer are connected to lead plates which are in turn connected to the plug pins. The electric shaver is capable of retaining the batteries by means of lead plates and plug pins.

DETAILED DESCRIPTION OF THE INVENTION

Figure 1:
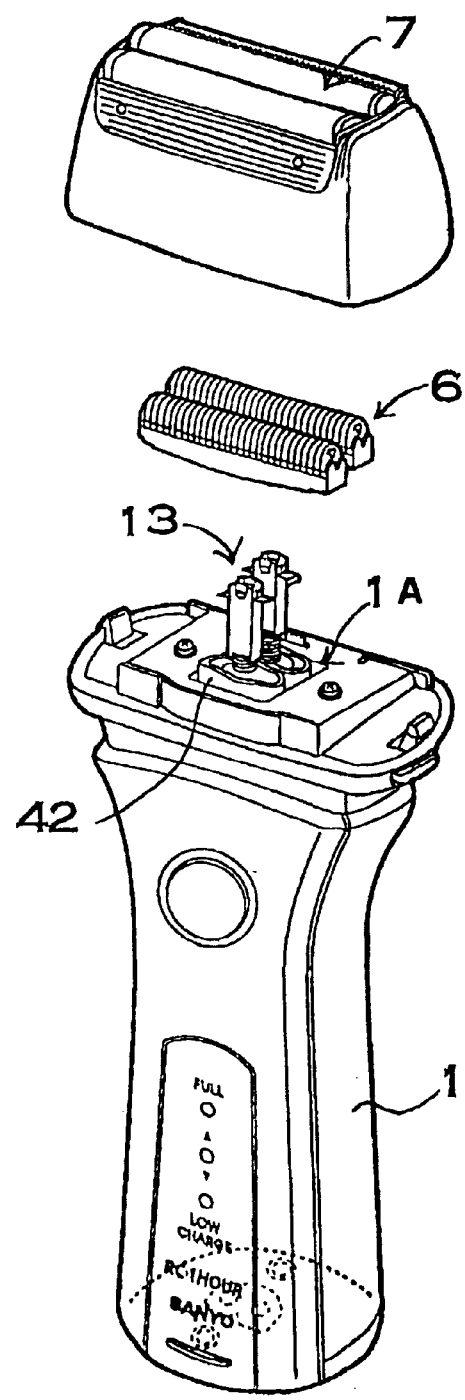
FIG. 1 an exploded perspective view of an embodiment according to the present invention.
Figure 2:
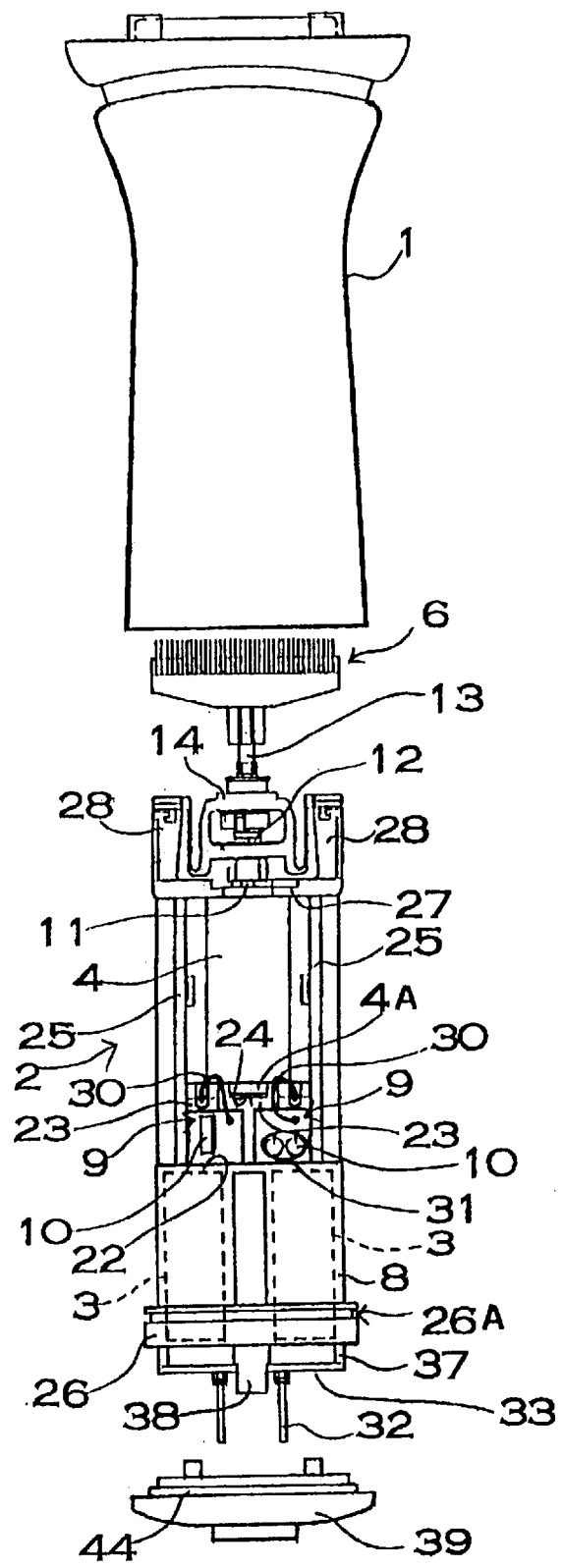
FIG. 2 is an exploded rear view of the electric shaver shown in FIG. 1.
Figure 3:
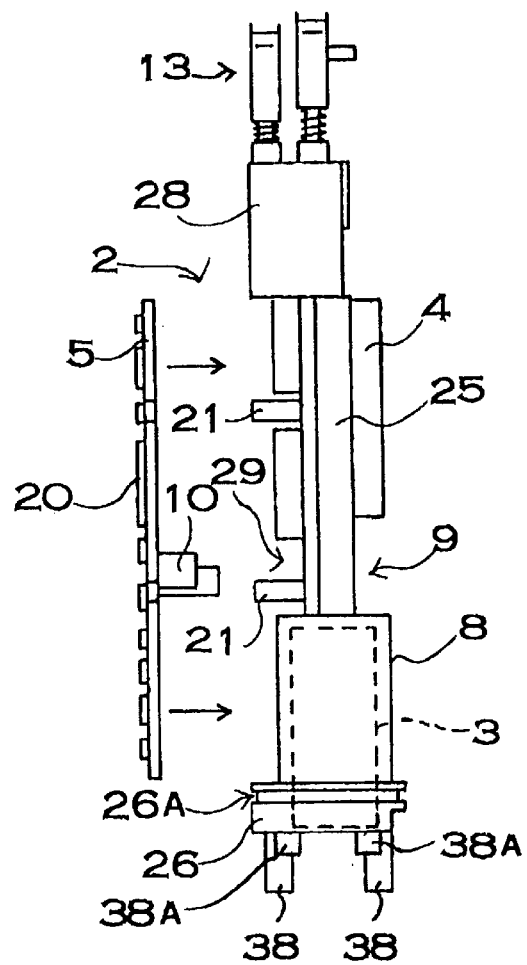
FIG. 3 is a side elevational view of the inner case shown in FIG. 2.

The electric shaver as shown in an exploded perspective view in FIG. 1, in a rear view, in FIG. 2, and in FIG. 3 comprises a motor 4 which drives an inner blades 6, a battery 3 for energizing the motor 4 an electronic parts (components) board 5 connected to the battery 3, an inner case 2 to which the parts board 5, the battery and the motor 4 are secured, and a plug board 33 having a pair of plug pins 32 the extremities of which project beyond the outer casing 1. FIG. 2 shows an inner case 2 partly drawn out of the outer casing.

The motor 4 drives the inner blades 6 in a reciprocating motion by means of a transforming mechanism which transforms rotational motion into a reciprocating motion. The transforming mechanism may be of the type presently in use or in the future. For example, a mechanism comprising a cam shaft 12 secured to a motor spindle 11, and a reciprocating member 14 to which the cam shaft 12 as well as the inner blades 6 are secured. The inner blades 6 reciprocate in slidable engagement with the inner surface of the outer blade 7 to cut off hairs projecting through beard cutting ports of the outer blade 7.

The battery 3 may be a Ni-MHD, Ni-CD, or Ni-Lithium type. One or several batteries are retained in the inner case 2. FIG. 2 shows a pair of batteries 3 retained in a retainer 8 of the inner case 2.

Figure 4:
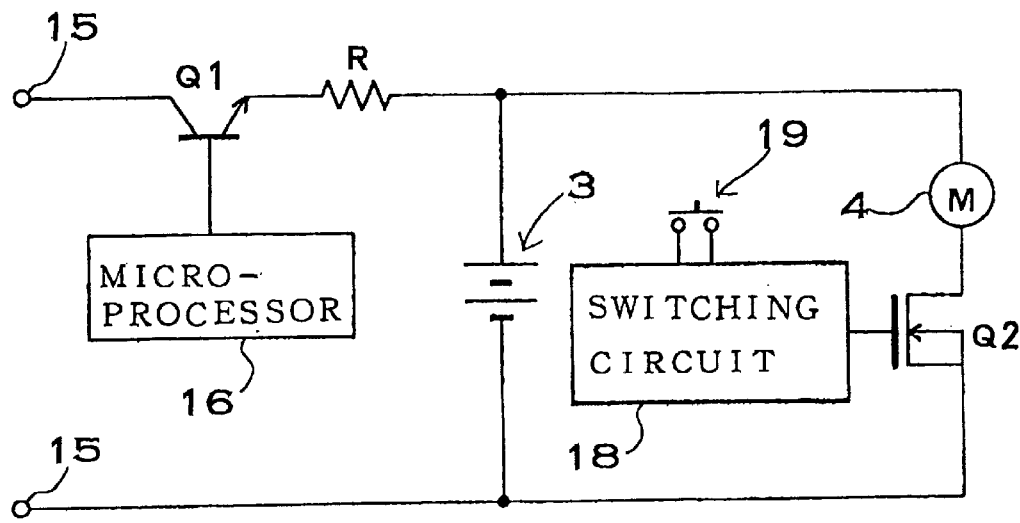
FIG. 4 is a circuit diagram showing the electrical circuit of an embodiment according to the present invention.

FIG. 4 shows a circuit diagram which includes electronic parts mounted on the parts board 5. The circuit on the parts board 5 includes a charge-control circuit for the battery 3 and a motor 4-controlling circuit. The battery-charging circuit includes a switching device connected to the battery 3 and the charging terminals 15, a microprocessor 16 for controlling ON/OFF states of the device Q1, and a charging resistor R connected in series between the switching device Ql and the battery 3. The parts board may include a power supply circuit capable of transforming the 100 V commercial power to a charge voltage of the battery.

The charge-control circuit supplies a charging current to the battery 3 through the switching device Q1 and the charging resistor R. The switching device Q1 generates heat by the energy proportional to the multiplication of current and voltage drop. The charging resistor R generates heat due to the energy proportional to the multiplication of the square of current and resistance. The switching device Q1 and the charging resistor R are heat-generating parts 10 because these parts conduct large currents. The power supply circuit also generates heat because the circuit includes a transformer for lowering 100 V commercial voltage into a charging voltage, a switching device and a rectifying diode which conduct a large current.

The charge-control circuit, shown in the figures, for the battery 3 is capable of calculating by means of a microprocessor the residual power of the battery based on the discharge time. The residual power is displayed by means of LEDs (not shown). The microprocessor 16 calculates ON time of switching device Q1 based on the residual power and controls the switching device.

The battery 3 is charged when the switching device is turned on as the electric shaver is placed on the charger or the power cable is connected to a commercial power outlet. The microprocessor calculates the time needed to fully charge the battery 3 and turns off the switching device Q1 when the battery 3 is fully charged, thus terminating the charging operation.

The motor-controlling circuit includes a switching device Q2 such as FET, a switching circuit 18 for turning on and off the switching device Q2, and a push switch 19 for inputting switching signals into the switching circuit 18. The switching circuit 18 switches on and off the switching device Q2 as the push switch 19 is pushed to send "H" or "L" signals. The circuit is characterized in that a push switch of simple structure is capable of turning on and off the motor. As the circuit supplies large currents to the motor, the switching device Q2 in the circuit generates a greater amount of heat. Therefore, the switching device Q2 is preferably placed in a section of the inner case. Instead of placing the switching device Q2 in a section, the device may be mounted on the rear side of the parts board because the switching device Q2 conducts smaller currents compared with the switching device Q1 generating less heat.

The parts board 5 shown in FIG. 3 has electronic parts on both sides. Heat generating device 10 is mounted so as to protrude into the section on the front side of the electronic parts board 5. The electronic parts board 5 has electronic parts 20 on the rear side at a position corresponding to the battery 3 and the motor 4. The electronic parts board 5 is secured in close proximity to the battery 3 and the motor 4 in the inner case 2.

Figure 5:
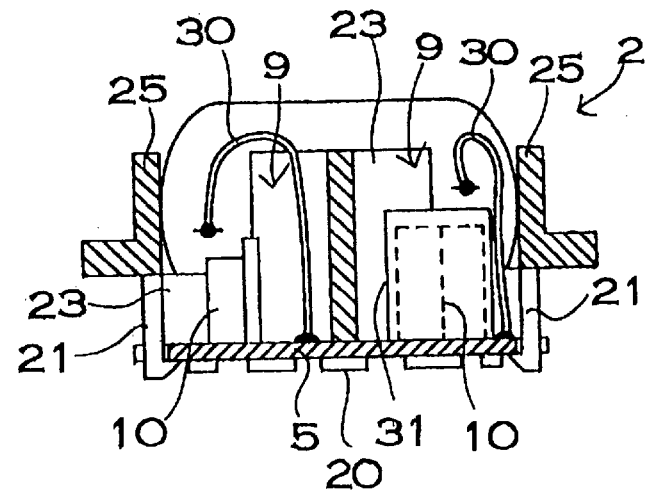
FIG. 5 is a cross-sectional view of the inner case shown in FIG. 2.

The inner case 2 is formed of plastics as an integral part. The inner case 2 shown in FIG. 3 is provided with a mounting surface at the rear for the parts board 5. Holding latches 21 are provided integral with the inner case, at both sides of the mounting surface, thereby resiliently holding the board 5 at both sides. Each of the holding latches has a hook-like end as shown in FIG. 5, which holds the parts board at its sides. The inner case 2 shown in the figure is provided with a pair of holding latches 21 at each side, totaling four holding latches, securing the electronic parts board 5 at two locations on each side.

As shown in FIG. 2, the inner case 2 is further provided with a section or space 9 between the motor 4 and the battery 3. The section 9 is provided for the purpose of admitting heat-generating part 10 mounted on the parts board. The section 9 has a separating wall 22 separating the section 9 from the battery 3. The inner case 2 has another wall 23 which is lower than the wall 22 separating the section 9 from the motor 4. As shown in FIG. 2, the wall 23 has a groove 24 on the side facing the motor 4 which receives a bearing housing 4A projecting from the casing. The groove 24 receives the motor housing projection 4A thereby securing the motor 4.

The wall 22 facing the battery 3 serves as a cover to close the bottom opening of the tubular retainer 8.

Figure 6:
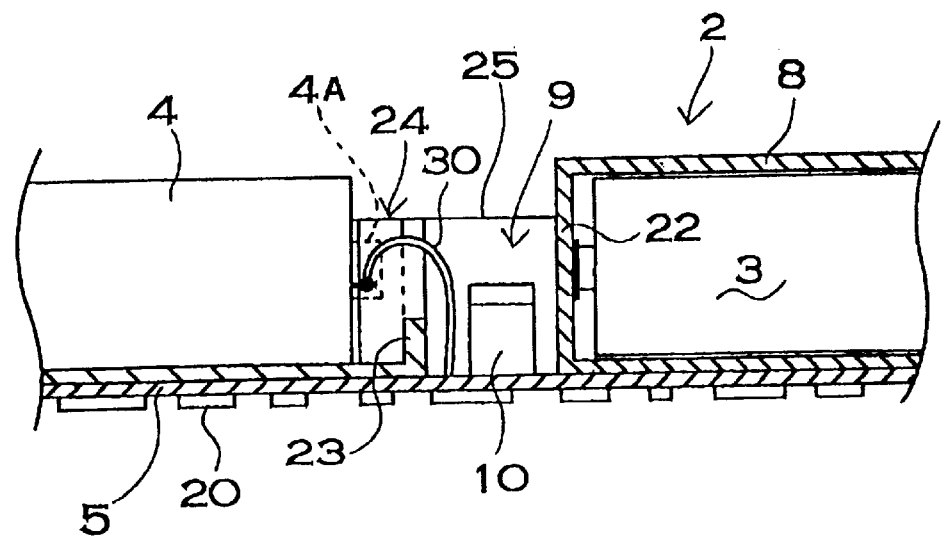
FIG. 6 is a vertical cross-sectional view of the inner case shown in FIG. 2.

The inner case 2 shown in FIG. 2, FIG. 3 and FIG. 6 is provided with the tubular retainer 8 as an integral part for receiving the battery 3. The tubular retainer 8 is capable of retaining a pair of juxtaposed cylindrical batteries. The tubular retainer ends in wall 22 at its bottom which separates the section 9 from the battery and prevents the battery 3 from slipping into the section 9. The opposite end of the retainer 8 is open for loading the battery 3.

Furthermore, the inner case 2 has side walls 25 integral with the inner case, which hold the motor 4 on both sides. The side walls 25 join with the tubular retainer 8 at their lower ends.

Thus, the inner case 2 shown in the figures is provided with the square section 9 enclosed by the side walls 25, and separating wall 22 facing the motor 4. The section 9 receives the heat-generating parts 10 mounted on the electric parts board. The section 9 is open at 29 toward the electronic parts board so as to admit the heat-generating parts 10 into the section.

Furthermore, the heat-generating part 10 in FIG. 5 is admitted in the right-side space and is covered with a heat-resistant tube 31. The heat-resistant tube 31 prevents the heat-generating part 10 from contacting the inner case 2, thereby protecting the batteries from heat.

As shown in FIG. 5 and FIG. 6 (lateral cross-section), the inner case is open at both upper and lower ends of the section 9. Furthermore, each of the side walls 25 has an opening at the bottom as shown in FIG. 5 and 6 so as to permit the air to flow out. The height of the side walls is lower than the battery case 8 so that air can pass through the gap between them.

The spaces of section 9 which are open at the top and bottom, allow lead wires connecting the electronic parts board 5 and the motor 4 to go through the open end. In the electric shaver shown in the figures, the lead wires 30 are connected, e.g., by soldering at their one end to the upper surface of the parts board 5. The leading wires 30 go upward through the section 9 to terminals of the motor 4. The structure of the section allows an optimum wiring of the lead wires 30 because the lead wires no longer require a clearance between the inner case and outer casing for the wires to pass through.

Figure 7:
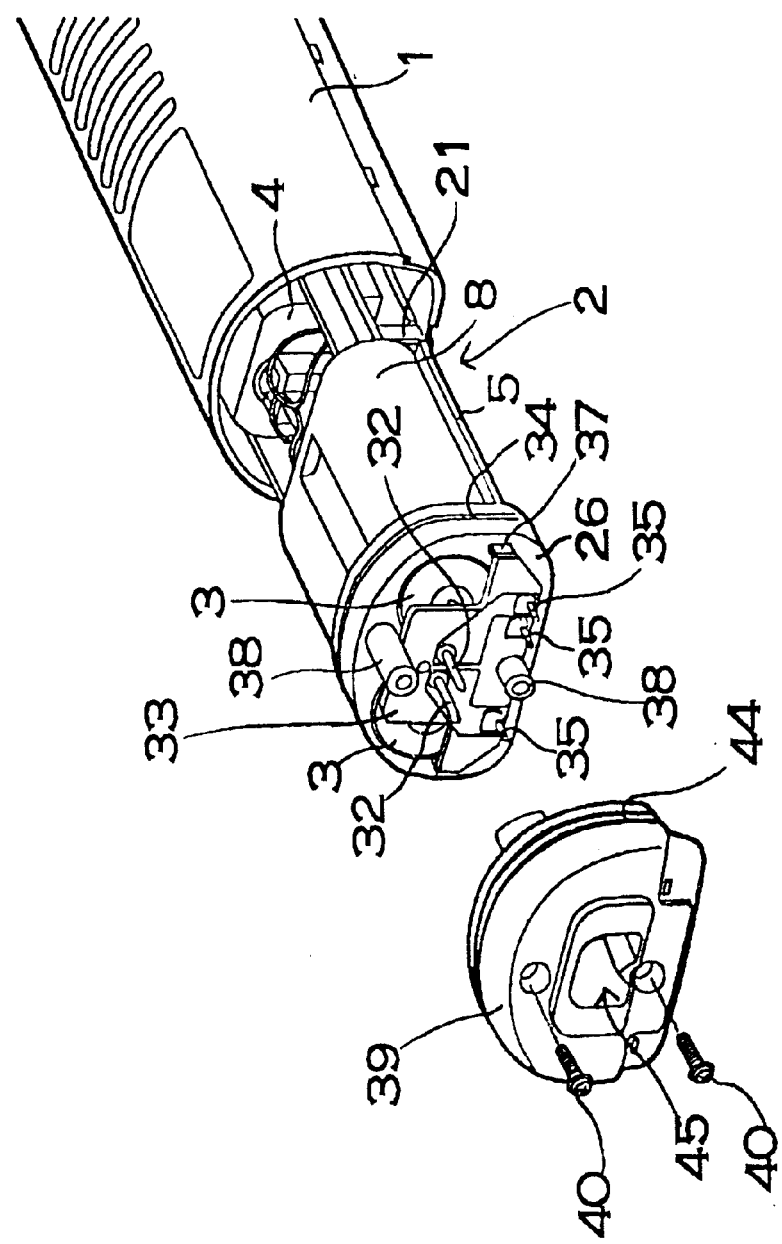
FIG. 7 is an exploded perspective view of an outer casing and an inner case as partly inserted in the outer casing.
Figure 8:
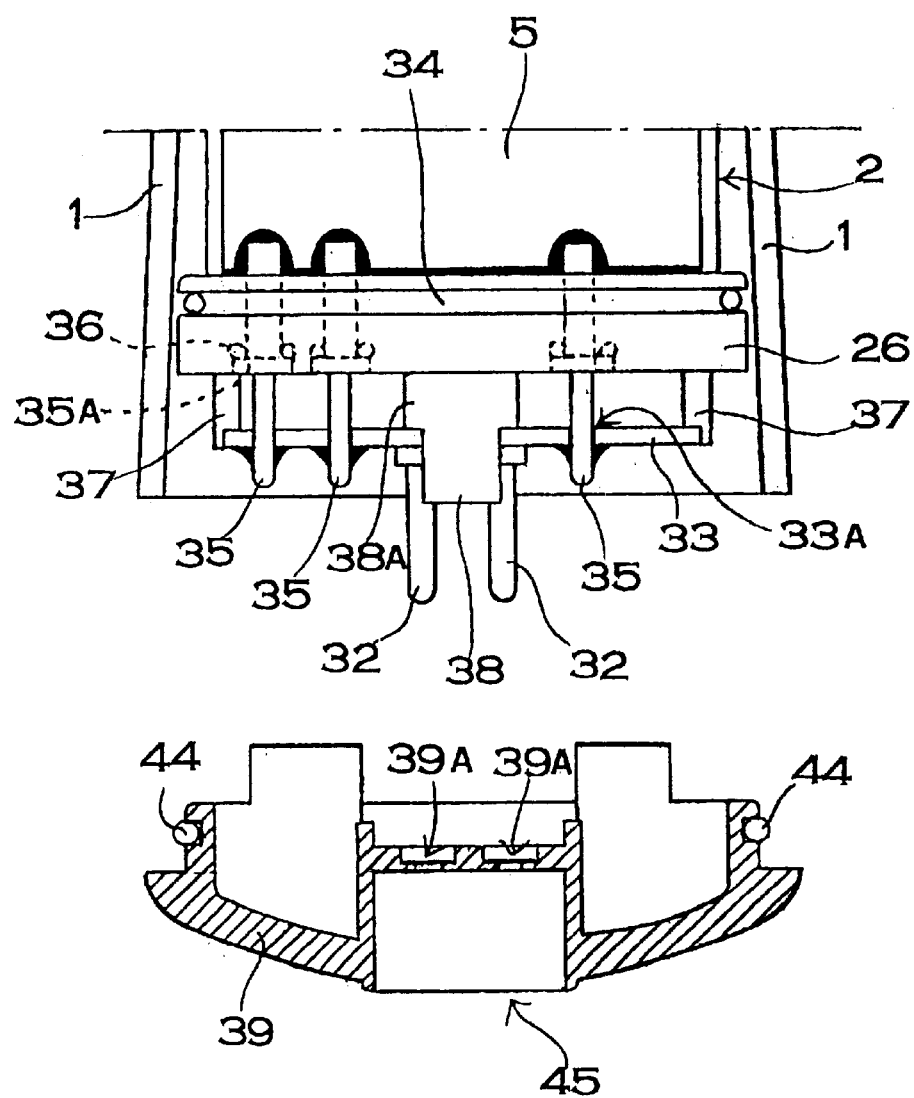
FIG. 8 is an exploded cross-sectional view of a lower portion of the electric shaver shown in FIG. 1.

The inner case 2 shown in FIG. 3, FIG. 7 and FIG. 8 has an integral lower separating wall 26, which closes the bottom end of the outer casing 1, and to which is connected, at its upper surface, the electronic parts board 5, and at its lower surface a plug board 33 parallel with the separation wall. The lower separating wall 26 has a groove 26A at its periphery for receiving an O-ring 34. The O-ring 34 in the groove 26A establishes a watertight contact with the inner surface of the outer casing, as the inner case 2 is retained in the outer casing to give the outer casing watertight structure.

The lower separating wall has through holes 26B through which a metal pin 35 is inserted connecting the electronic parts board 5 and the plug board 33. The lower separating wall 26 of the inner case, shown in FIG. 7 and FIG. 8, is provided with three through holes 26B. Each of the through holes 26B is a circular hole having the diameter equal to that of the metal pin. Thus, the holes 26B are able to keep the metal pin in a fixed position.

The lower separating wall 26, shown in FIG. 8, has an enlarged recess at the lower surface, in which an O-ring 36 is received so that the pin 35 is secured watertight to the lower separating wall 26. The through holes in the lower separating wall 26 receive a flanged portion 35A of the metal pin 35. Each of the through holes 26B admits the metal pin 35 inserted from the plug board 33 until the pin reaches the electronic parts board 5 thereby holding the metal pin 35 and the electronic parts board in position. The O-ring-flange structure gives the through holes 26B water tightness.

Figure 9:
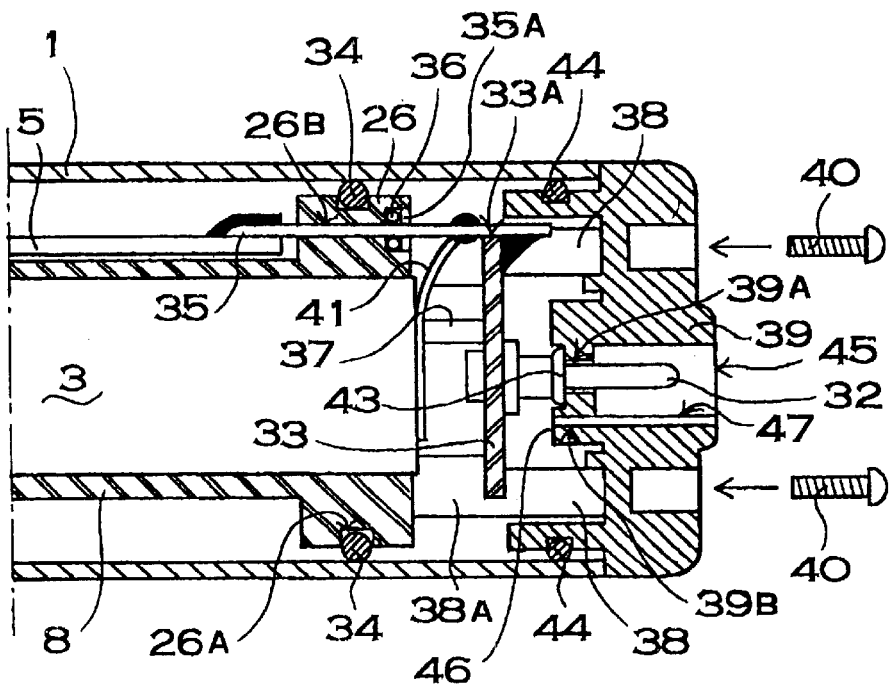
FIG. 9 is a cross-sectional view of a lower portion of an electric shaver.

The lower separating wall 26 shown in FIG. 7 and FIG. 8 has, as integral parts thereof, support members 37 for supporting the plug board, projecting toward the bottom of the inner case, and support members 38 for supporting the bottom cover 39. The plug board support members 37 and bottom cover support members 38 support the plug board 33 at four points. With these support members, the inner case is capable of supporting the lower separating wall 26 and the plug board 33 in parallel to each other. The support members 37, 37 support the plug board 33 on the bottom sides, whereas the support members 38,38 support the board on both sides as shown in FIG. 9. Each of the support members 37, 37 has a L-shaped recess for receiving the plug board 33. As shown in FIG. 8 and FIG. 9, the support members 38, 38 have an enlarged portion 38A at their root to form a shoulder to support the plug board 33.

The support member 38 has a threaded hole which provides an anchor for a screw 40 which secures the bottom cover 39. The inner case 2 shown in FIG. 7 has bottom cover supports 38, 38 aligned with the gorge between two juxtaposed batteries. The support arrangement permits the inner case 2 and lower separating wall 26 to be made smaller because the space between the batteries is used for the support members 38.

The metal pin 35, inserted into the through hole 26B, is fastened at one end to electronic parts board 5 and at the other end to the plug board 33, thereby holding these boards in place. The metal pin 35 is fastened, e.g., by means of soldering to the electronic parts board and plug board 33. Alternatively, the metal pin 35 can be detachably fastened to the electronic parts board and plug board 33. The inner case 2 shown in figures has three metal pins connecting the electronic parts board 5 and plug board 33. Two of the metal pins 35, 35 are connected to the plug pins 32, 32, respectively. Either of the two plug pins 32, 32 is connected to either of the electrodes of the battery 3 by means of a leading plate 41. The other plug pin 32 is also connected to the electrode of the battery by means of a leading plate 41.

The electronic part board 5 and the plug board 33 are made of a printed circuit board formed of epoxide resin with a thin conductive metal layer on its surface. The parts board 5 and plug board 33 have an enlarged metal layer to which the metal pin is connected. The plug board 33 has a recess 33A intended to receive the metal pin 35 in order to firmly secure the board in the inner case 2. The recess 33A may be a through hole or a groove capable of holding the metal pin 35. The plug board 33 is provided with a thin layer of metal connecting a pair of plug pins 32 and a pair of metal pins 35.

The outer casing 1, which is made of plastics, as shown in FIG. 1 and FIG. 2, exposes an oscillating rod 13 secured on a reciprocating member 14 through a watertight sealing member at its upper end while the bottom end is closed by means of a bottom cover 39 with watertight sealing means. In order to ensure a watertight contact of the reciprocating mechanism, the upper opening 1A of the outer casing 1 has a rubber membrane 42 through which extends the oscillating rod 13. The rubber membrane 42 is fixed watertight at its periphery to the opening 1A of the outer casing 1 which penetrates the oscillating rod 13. The through hole of the rubber membrane 42 is secured watertight to the oscillating rod 13.

As shown in FIG. 8 and FIG. 9, the bottom cover 39 has a pair of through holes 39A, 39A for receiving the plug pins 32. The plug pins penetrate the through holes 39A, 39A with water tightness so that the ends of the plug pins protrude out of the outer casing 1. In order for the plug pins 32 to penetrate with water tightness, the pins 32 are provided with an O-ring 43 which is tightly pressed on the inner surface of the bottom cover 39. Furthermore, the bottom cover 39 is provided with another O-ring 44 at its periphery to ensure a watertight coupling.

The bottom cover 39 has a chamber 45 aligned with the plug pins 32 to admit the pins 32. The chamber 45 is deep enough to prevent the pins from protruding out of the contour of the outer casing. The chamber is so configured as to receive a power source plug. The plug pins 32 are then connected by means of the power source plug to the power outlet.

Figure 10:
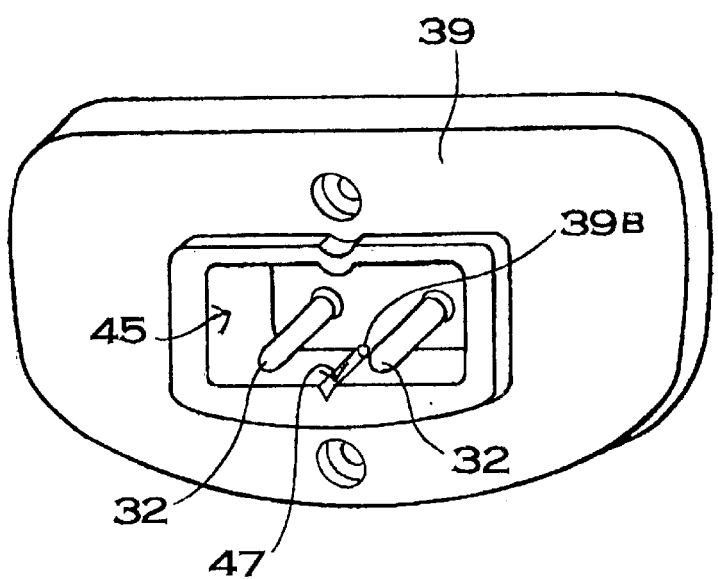
FIG. 10 is enlarged perspective view of a bottom cover.

The bottom cover 39 is provided with a safety valve 46 to discharge the gas emitted by the battery 3 when the internal pressure becomes critical. The safety valve 46 consists of a membrane fixed in the inner surface of a relief hole 39B which penetrates the bottom cover 39. The membrane sealing the relief hole 39B breaks and allows air to flow out when the internal pressure rises high enough. As shown in FIG. 10 schematically, the relief hole 39B is formed inside the chamber 45 and communicates with a groove 47 on the wall of the chamber 45. The relief hole 39B is protected from damage by piercing with e.g., a needle by the user. The other material of the sheet of a membrane is one through which the air can communicate and water cannot communicate.

The above-mentioned electric shaver has an air-tight chamber between the lower separating wall 26 and bottom cover 39, both of which are sealed by resilient O-rings 34 and 44 at their periphery. The battery case which retains the battery 3 is sealed at the upper end whereas it communicates with the air tight chamber at the bottom end. The structure of the battery case enables airtight retention. Once gas is emitted from the battery 3, the chamber pressure rises. When the pressure rises over the preselected level, the membrane is broken by the pressure to let air flow out of the chamber. In the electric shaver with the structure above, the gas emitted from the battery 3 is not allowed to enter the chamber for the electronic parts including the motor 4, thereby protecting the electronic parts board from the gas. Even if the membrane is broken and water enters the chamber, the electronic parts board and the motor 4 are protected from the water.

Furthermore, the inner case 2 is provided with a cross rib 27 at the top of the side walls 25 for retaining the motor 4. The motor 4 is retained by the cross rib 27, side walls 25 and separating wall 23. Furthermore, the inner case 2 has a connecting mechanism 28 at the top of the side walls 25 for securing resilient arms of reciprocating member 14.

Figure 11:
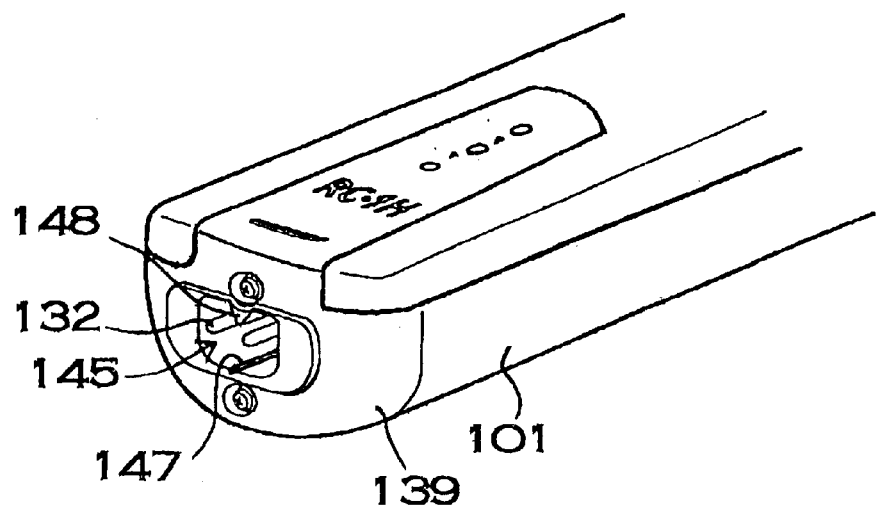
FIG. 11 is a perspective view of another embodiment of the electric shaver according to the present invention.
Figure 12:
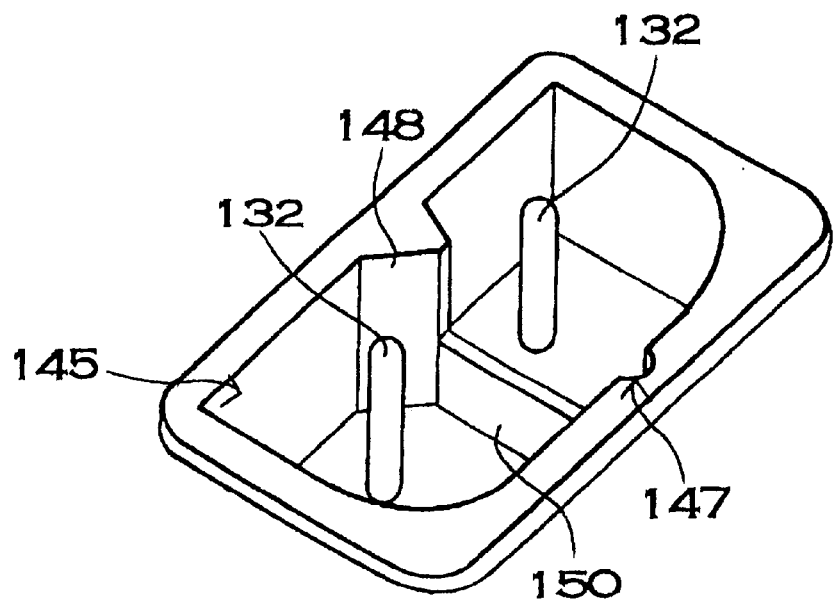
FIG. 12 is a perspective view of the chamber shown in FIG. 11.
Figure 13:
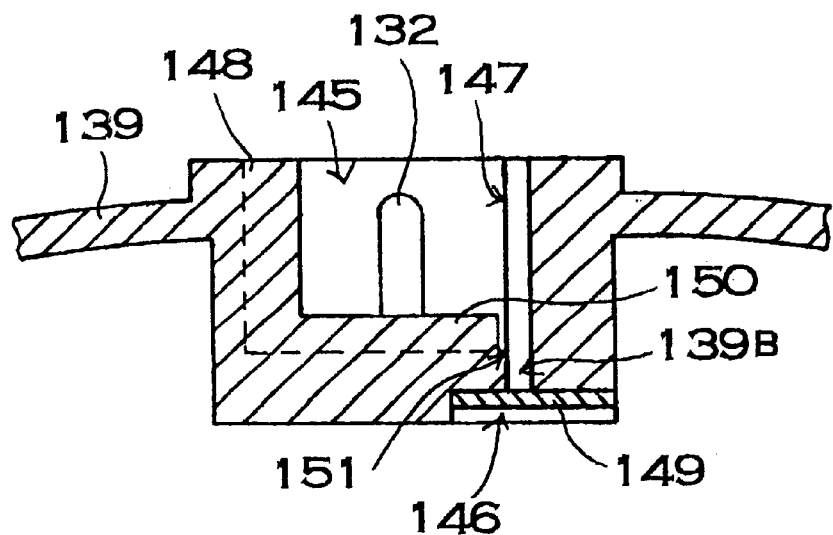
FIG. 13 is a cross-sectional view of the chamber shown in FIG. 12.
Figure 14:
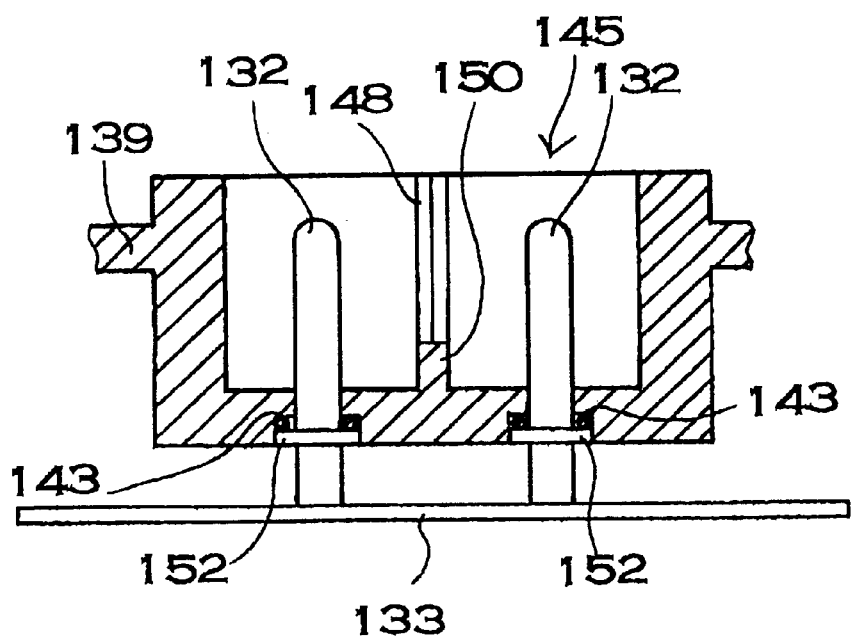
FIG. 14 is a vertical cross-sectional view of the chamber shown in FIG. 12.
Figure 15:
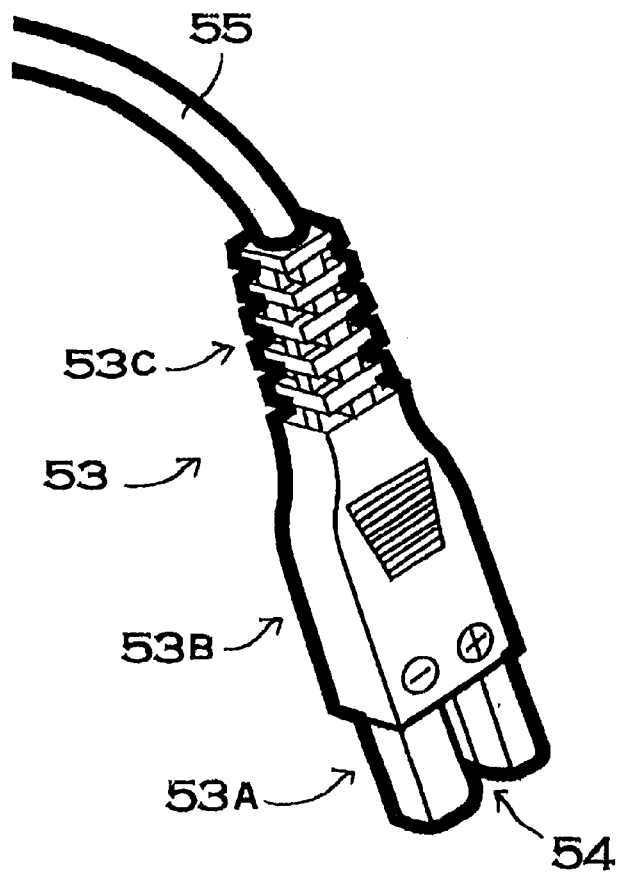
FIG. 15 is a schematic view of a power source connector.
Figure 16:
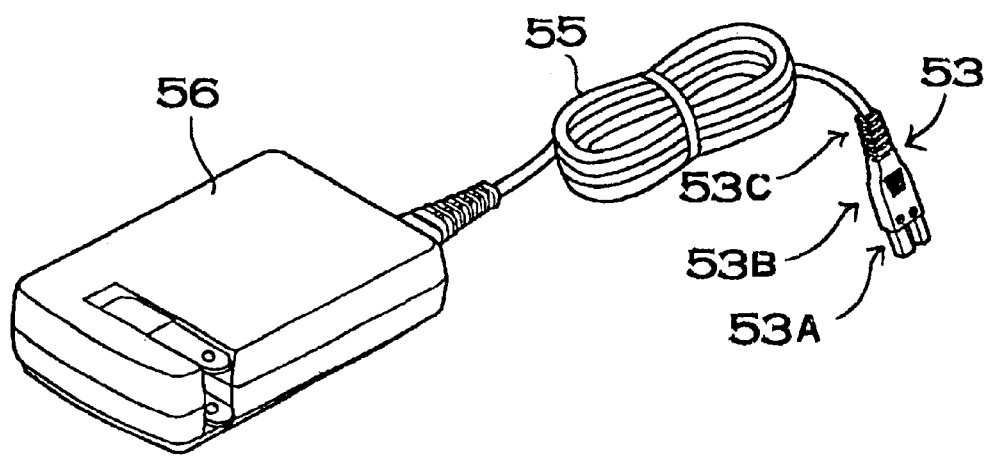
FIG. 16 is a perspective view of an adapter connected to the plug shown in FIG. 15.

FIG. 11 shows another embodiment having a bottom cover with a chamber of another configuration for receiving a power source plug. FIG. 12 shows a schematic view of the chamber 145 on an enlarged scale. FIG. 13 and FIG. 14 show a cross-sectional and vertical cross-sectional view respectively. The chamber 145 shown in these figures has a horizontally elongated square configuration. The chamber 145 has an axially elongated configuration as shown in FIG. 15 and FIG. 16 so that it enables smooth and guided insertion of the power source plug. The power source plug 53 is inserted perpendicularly to the surface of the bottom cover 139, therefore, the chamber 145 has an axially elongated column-like configuration. "Column-like" means a chamber having the same cross-section along the direction of insertion.

The chamber 145 shown in FIG. 12 through 14 has an elongated guide projection 148 to prevent a wrong insertion of the plug 53. The guide projection 148, formed integral with the bottom cover, extends in the direction of insertion of the plug 53. The guide projection 148 has a triangular cross-section and is formed at the middle of the side walls. Furthermore, the chamber 145 has rounded corners at both sides, the corner of each side having a different diameter so that wrong insertion of the plug is avoided. The chamber 145 has a kind of rounded corners with a smaller diameter on the side where the guide projection is formed as well as another kind of rounded corners with a different diameter on the other side. Furthermore, the chamber 145 is provided with a groove 147 opposite to the guide projection 148, which communicates with a through hole 139B in the bottom cover 139. The through hole 139B is closed with a membrane 149 at the inner face of the outer casing 101. The membrane 149 seals the through hole 139B in normal use, but it breaks under pressure to discharge the air inside the outer casing when the pressure inside the outer casing 101 rises to a certain level. The through hole 139B communicating with the groove inside the chamber together with sealing membrane 149 functions as a safety valve 146. The safety valve is protected from piercing with e.g. a needle by the user.

The chamber 145 is provided with a leak prevention wall 150 at the bottom to prevent leakage of current due to conductive water and corrosion of the plug pins by current due to conductive water. The chamber 145 is divided into two blocks by leak prevention wall 150. The leak prevention wall 150 is formed at the bottom of the chamber 145 as a projection integral with the bottom cover, which is made of plastics. The leak prevention wall 150 prevents current from flowing between the plug pins 132, 132. The leak prevention wall 150 is made of insulating materials. The outer casing of electric home appliances is made of plastics without exception. Therefore, the leak prevention wall 150 is made integral with the outer casing of plastics.

The leak prevention wall 150 is not capable of preventing leakage if it is too low. Therefore, the height of the wall is preferably 1–5 mm or more preferably 2–4 mm. The leak prevention wall 150 is formed as a continuing part of the guide projection 148. The leak prevention wall 150 functions as a guiding member for the power source plug 53 when the plug is inserted into the chamber 145. The leak prevention wall 150 avoids improper insertion of the plug 53 into the chamber 145 by virtue of the recess 54 of the plug 53 shown in FIG. 17. To avoid faulty insertion of the plug 53, the leak prevention wall 150 must be strong enough. Therefore, it is 0.5–2 mm in thickness or more preferably 1 mm in thickness.

The chamber 145 shown in FIG. 13 is provided with a leak prevention wall 150 which is joined at one end to the inner face of the chamber 145, but is separated at the other end from the chamber wall leaving a narrow gap 151 for the through hole 139B of the safety valve.

A pair of plug pins 132, 132 are fixed, one on each side of the leak prevention wall 150, spaced apart and parallel to each other. In the figure, two plug pins 132 are fixed in the chamber 145 spaced apart along the longer side of the chamber. To supply power, at least two plug pins 132 are needed. If needed, three or more plug pins may be used, in which case two of them are used for supplying power, one for sending signals.

In order to realize water-proof structure of the outer casing 101 of the shaver shown in the figures, the plug pins 132, 132 are sealed and fixed to the bottom cover 139. As shown in FIG. 14, the plug pins 132 have a flange 152 which presses an O-ring 143 to the inner surface of the bottom cover 139 thereby realizing water-proof plug pins 132. The plug pin 132 is fixed to the plug board 133 secured in the outer casing 101. The flanged plug pin 132 exerts pressure on the O-ring 143 to obtain water-proof bottom cover 139.

As shown in FIG. 15, the power source plug 53 has an insert portion 53A at its end which is to be inserted in a correct position or pulled out of the chamber 145. The insert portion 53A of the plug is configured corresponding to the inner configuration of the chamber 145, thereby ensuring smooth and sufficient insertion.

The power source plug 53 is connected by way of the power cord 55 to the adaptor 56.

Next to the insert portion 53A, the power source plug 53 has a gripping part 53B, and a resilient bushing part 53C integrally formed therewith of plastics. The gripping part 53B is sized sufficiently large so that the user can grip it easily. The bushing part 53C is flexible to prevent the cord from severing due to wear.

Figure 17:
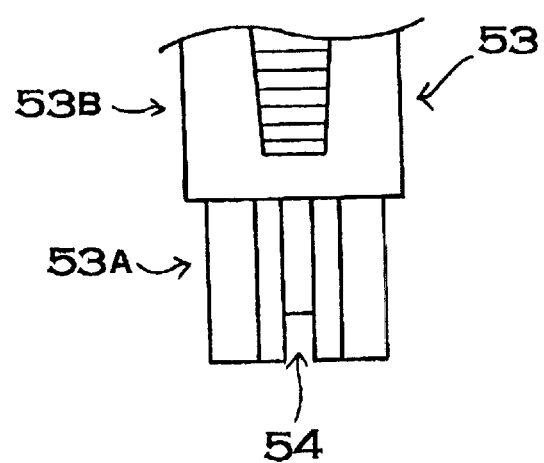
FIG. 17 is a front view of the plug shown in FIG. 15.

As shown in FIG. 17, the power source plug 53 has a recess 54 at the end of the insert portion 53A to admit the leak prevention wall 150 in the chamber 145. The depth of the recess 54 is equal or slightly greater than the height of the leak prevention wall 150. The width of the recess 54 is equal to that of the wall 150. As the power source plug 53 is inserted into the chamber 145, the recess 54 in the insert portion 53A receives the leak prevention wall 150.

The insert portion 53A is provided with connecting terminals (not shown) to be connected to the plug pins 132, 132. The connecting terminals are made with a metal plate which is formed in a resilient cylinder. The internal diameter of the cylinder is slightly less than the external diameter of the plug pin 132. When the plug pins 132, 132 are inserted into the cylindrical connecting terminals, the resilient cylinders expand slightly and exert pressure on the plug pins 132, 132 to establish a firm connection. The insert portion 53A is provided with a pair of guide holes to receive the plug pins 132.

Furthermore, each of the connecting terminals is connected to a lead wire within the gripping part 53B, and the lead wire is connected to the adaptor 56. When the power source plug 53 is inserted in the chamber 145, the adaptor 56 is connected via the lead wire and connecting terminals to the plug pin 132 to supply power to the electric apparatus.

The electric shaver of the type described above has the advantages that current leakage flowing through the water trapped in the chamber as well as faulty connection of the plug and plug pin is avoided. The advantage is attained by implementing the leak prevention wall in the chamber, which separates the water trapped around the plug pins and makes a longer leakage channel thereby avoiding current leakage. The leak prevention wall reduces current leakage even if water is trapped in the chamber thus reducing electro-erosion of plug pins or connector terminals. The advantage is especially important for a washable electric household appliance e.g., an electric shaver, because electroerosion shortens service time of electric appliances even if the sealing of the casing is perfect.

Furthermore, the electric shaver with the leak prevention wall has the advantage that the wall functions as a guide member when the power source plug is inserted ensuring a smooth and sufficient insertion of the power source terminals into the plug pins.

Furthermore, the electric shaver described above is capable of preventing inclined insertion of the power source plug into the chamber by virtue of the guiding recess of the plug. In other words, the power source plug is perfectly inserted into the chamber avoiding faulty connection between the plug pins and the connector terminals. Undesirable forces can be eliminated when the plug is pulled out of the chamber.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An electric shaver comprising:
   a) an electric motor for reciprocating an inner blade assembly;
   b) at least one battery for the electric motor;
   c) an electronic parts board connected to the battery;
   d) an inner case having a lower separating wall defining a plurality of through holes, the inner case retaining the electronic parts board and the electric motor;

e) an outer casing having a bottom opening and a bottom cover closing the bottom opening, the outer casing containing the inner case at a fixed position in tight contact with the lower separating wall of the inner case, wherein the bottom cover includes a plurality of through holes;

f) a plug board securing a plurality of plug pins; and g) a plurality of metal pins inserted into the through holes in the lower separating wall, wherein each of said metal pins is connected at one end to the electronic parts board and at the other end to the plug board, wherein the plug pins extend through the through holes in the bottom cover so that the plug pins extend outwardly from the outer casing.

2. An electric shaver as claimed in claim 1, wherein the outer casing is fabricated of a plastic in a tubular configuration.

3. An electric shaver as claimed in claim 1, wherein the lower separating wall is provided with an O-ring at its periphery to effect a watertight contact with an internal peripheral surface of the outer casing.

4. An electric shaver as claimed in claim 1, wherein the bottom cover is provided with an O-ring at its periphery to obtain a watertight contact with an internal peripheral surface of the outer casing.

5. An electric shaver as claimed in claim 1, wherein each of the plug pins is provided with an O-ring abutting an interior peripheral surface of the bottom cover in order to provide a watertight contact with the corresponding through hole in the bottom cover.

6. An electric shaver as claimed in claim 1, wherein a safety valve is provided in the bottom cover, and the safety valve is capable of opening at a predetermined pressure level.

7. An electric shaver as claimed in claim 6, wherein the lower separating wall has an O-ring at its periphery to obtain a watertight contact with the outer casing, the bottom cover has an O-ring at its periphery to obtain a watertight contact with the outer casing, and each of the plug pins has an O-ring abutting on an interior peripheral surface of the bottom cover to provide a watertight contact with the corresponding through hole in the bottom cover.

8. An electric shaver as claimed in claim 1, wherein the inner case is fabricated of a plastic, and is provided with a plurality of integral holding latches.

9. An electric shaver as claimed in claim 1, wherein on end of each of the metal pins is connected to the electronic parts board by means of soldering.

10. An electric shaver as claimed in claim 1, wherein the electric motor and the battery are mounted in the inner case, and are separated from each other by a space defined in the inner case, wherein the inner case is fixed to the electronic parts board on one side thereof so that at least one heat-generating part, which is mounted on the electronic parts board, is received in the space between the electric motor and the battery.

11. An electric shaver as claimed in claim 10, wherein the inner case includes an integrally formed plastic tubular case for retaining the battery, and the upper end of the tubular case is closed.

12. An electric shaver as claimed in claim 10, wherein the heat-generating part protrudes from the electronic parts board.

13. An electric shaver as claimed in claim 10, wherein the heat-generating part is a charging resistor connected in series with the battery, a semiconductor switching element for controlling charging and discharging operations, or a power source transformer for charging the battery.

14. An electric shaver as claimed in claim 1, wherein the bottom cover includes a chamber and a separation wall disposed in the chamber between the plug pins.

15. An electric shaver as claimed in claim 14, further comprising a power source plug, which is to be inserted into the chamber of the bottom cover, wherein the power source plug has a recess for receiving the separation wall when the power source plug is inserted into the chamber.

16. An electric shaver recited in claim 14, wherein one end of the separation wall joins an internal wall of the chamber, and the other end of the separation wall is separated from the internal wall of the chamber by a gap which communicates with a valve hole of a safety valve provided at a bottom of the chamber.

17. An electric shaver comprising:

an inner case having a tubular case and a lower separating wall defining a plurality of through holes;

an electronic parts board connected to the inner case;

a pair of batteries retained in the tubular case in a side-by-side arrangement and in parallel to the electronic parts board;

an electric motor electrically connected to the batteries for reciprocating an inner blade assembly, the electric motor being retained by the inner case;

an outer casing having a bottom opening and a bottom cover closing the bottom opening, the outer casing receiving the inner case in a fixed position and in contact with the lower separating wall of the inner case, wherein the bottom cover includes a plurality of through holes;

a plug board provided with a plurality of plug pins; and a plurality of metal pins inserted into the through holes in the lower separating wall, wherein each of the metal pins is connected at one end to the electronic parts board and at the other end to the plug board, wherein the plug pins extend through the through holes in the bottom cover of the outer casing so that the plug pins extend outwardly from the outer casing.

18. An electric shaver as claimed in claim 17, wherein the inner case has a plurality of support members for supporting the bottom cover, and the support members are disposed on a bottom end of the inner case at spaces between the pair of batteries.

19. An electric shaver as claimed in claim 17, wherein an upper end of the tubular case is closed while a bottom end thereof is open.

20. An electric shaver as claimed in claim 19, wherein the pair of batteries are retained In the tubular case by means of lead plates abutting on a lower end of one of the batteries and one of the plug pins.

* * * * *